US010295620B2

(12) United States Patent
Driemel et al.

(10) Patent No.: US 10,295,620 B2
(45) Date of Patent: May 21, 2019

(54) MAGNETIC RESONANCE COIL APPARATUS

(71) Applicants: Daniel Driemel, Oederan (DE); Jörg Rothard, Litzendorf (DE)

(72) Inventors: Daniel Driemel, Oederan (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 421 days.

(21) Appl. No.: 14/748,672

(22) Filed: Jun. 24, 2015

(65) Prior Publication Data
US 2015/0377990 A1   Dec. 31, 2015

(30) Foreign Application Priority Data

Jun. 25, 2014   (DE) ........................ 10 2014 212 192

(51) Int. Cl.
*G01R 33/34*   (2006.01)
(52) U.S. Cl.
CPC .. *G01R 33/34007* (2013.01); *G01R 33/34046* (2013.01)
(58) Field of Classification Search
None
See application file for complete search history.

(56) References Cited

U.S. PATENT DOCUMENTS

| 767,971 | A | * | 8/1904 | Green, Jr. et al. | ....... | H04B 1/16 |
| | | | | | | 375/338 |
| 5,704,711 | A | * | 1/1998 | Simmons | ................. | B01F 9/06 |
| | | | | | | 366/199 |
| 7,030,612 | B1 | * | 4/2006 | Damadian | ............ | A61B 5/0555 |
| | | | | | | 324/318 |
| 9,285,440 | B2 | * | 3/2016 | Driemel | ........... | G01R 33/34007 |
| 2006/0164086 | A1 | * | 7/2006 | Kohlmuller | .......... | A61B 5/0555 |
| | | | | | | 324/307 |
| 2009/0182221 | A1 | * | 7/2009 | Kasugai | ............... | A61B 5/0555 |
| | | | | | | 600/410 |
| 2011/0260728 | A1 | * | 10/2011 | Biber | ............... | G01R 33/34061 |
| | | | | | | 324/318 |
| 2013/0023756 | A1 | * | 1/2013 | Driemel | ................. | G01R 33/28 |
| | | | | | | 600/422 |
| 2013/0307535 | A1 | * | 11/2013 | Taracila | ............. | G01R 33/3415 |
| | | | | | | 324/307 |

FOREIGN PATENT DOCUMENTS

DE        102011079575 A1      1/2013

OTHER PUBLICATIONS

German Office action for related German Application No. 10 2014 212 192.2, dated Mar. 19, 2015, with English Translation.

* cited by examiner

*Primary Examiner* — Melissa J Koval
*Assistant Examiner* — Nasima Monsur
(74) *Attorney, Agent, or Firm* — Lempia Summerfield Katz LLC (57) ABSTRACT

A magnetic resonance coil apparatus is provided, the apparatus having a posterior coil unit including a base unit and a further coil component, wherein the further coil component is arranged so as to be able to be tilted on the base unit with respect to the base unit and wherein the posterior coil unit includes a position acquisition unit.

13 Claims, 4 Drawing Sheets

FIG 6

MAGNETIC RESONANCE COIL APPARATUS

CROSS-REFERENCE TO RELATED APPLICATIONS

This application claims the benefit of DE 10 2014 212 192.2, filed on Jun. 25, 2014, which is hereby incorporated by reference in its entirety.

TECHNICAL FIELD

The present embodiments relate to a magnetic resonance coil apparatus having a posterior coil unit including a base unit and a further coil component, wherein the further coil component is arranged so as to be able to be tilted on the base unit with respect to the base unit.

BACKGROUND

In magnetic resonance tomography and/or magnetic resonance imaging, images with a high signal-to-noise ratio may be recorded by local magnetic resonance coil apparatuses. To this end the local magnetic resonance coil apparatuses are positioned on a subregion of the patient to be examined for the magnetic resonance examination. These magnetic resonance coil apparatuses include antenna systems that are mounted in immediate proximity to (e.g., on (anterior) or under (posterior)) the patient. In the course of an magnetic resonance measurement, the excited nuclei induce a voltage into the individual antennas of the local coil, which voltage is then amplified by a low-noise preamplifier and finally forwarded by a wired connection to the receive electronics.

With special magnetic resonance examinations, it may be useful to tilt the corresponding local magnetic resonance coil apparatus with respect to a support surface upon which the patient is supported for the magnetic resonance examination. A repetition and/or a reproducibility of such a magnetic resonance examination is however particularly difficult since with hindsight it is often no longer possible to determine the tilting angle with which the local magnetic resonance coil apparatus was arranged for the magnetic resonance examination with respect to the support surface.

SUMMARY AND DESCRIPTION

The scope of the present invention is defined solely by the appended claims and is not affected to any degree by the statements within this summary. The present embodiments may obviate one or more of the drawbacks or limitations in the related art.

In certain embodiments, magnetic resonance coil apparatuses are configured to be tiltable to provide an exact position acquisition in order to acquire a tilting angle for a reproducibility of a magnetic resonance examination.

The embodiments relate to a magnetic resonance coil apparatus having a posterior coil unit including a base unit and a further coil component, wherein the further coil component is arranged so as to be able to be tilted on the base unit with respect to the base unit.

It is proposed that the posterior coil unit includes a position acquisition unit. The position acquisition unit is herewith configured such that a tilting position of the further coil component with respect to the base unit may be acquired by the position acquisition unit. A tilting position of the magnetic resonance coil apparatus with respect to a support surface upon which the patient is supported for a magnetic resonance examination may be determined and/or acquired by the acquired tilting position of the further coil component with respect to the base unit. Moreover, an examination position of the magnetic resonance coil apparatus and thus also of the patient may be particularly easily reproduced for a further magnetic resonance examination on account of the acquired position, (e.g., tilting position), of the further coil component with respect to the base unit.

The magnetic resonance coil apparatus may include an anterior coil unit and a posterior coil unit, wherein the anterior coil unit and the posterior coil unit surround a receiving area for receiving a subregion of the patient, like for instance a head of the patient and/or a knee of the patient, etc. The posterior coil unit rests here with a side facing away from the receiving area on a patient support apparatus, which is embodied so as to be movable in order to support the patient within a magnetic resonance apparatus. The side of the posterior coil unit facing away from the patient receiving area is incorporated in the base unit, the position of which may be kept unchanged during the entire magnetic resonance examination with respect to the patient support apparatus, e.g., a support surface of the patient support apparatus. Moreover, the base unit may also be mounted on the support surface of the patient support apparatus. The posterior coil unit particularly advantageously includes in addition at least one swivel joint and/or hinge, by which the further coil component is arranged and/or mounted on the base unit so as to be tiltable with respect to the base unit.

By adjusting a tilting position of the further coil component with respect to the base unit, an alignment and/or position of the receiving area of the magnetic resonance coil apparatus also changes with respect to the patient support apparatus, e.g., with respect to the support surface of the patient support apparatus. In particular, a position and/or alignment of the entire magnetic resonance coil apparatus herewith changes with the exception of the base unit with respect to the patient support apparatus, e.g., the support surface of the patient support apparatus. The base unit may be arranged in parallel with the support surface of the patient support apparatus.

Patient comfort may be advantageously increased using a tilting position of the further coil component with respect to the base unit, by it being possible for instance for the position of the local magnetic resonance coil apparatus to be adjusted in particular to an anatomy of the patient. If the magnetic resonance coil apparatus is formed for instance from a head coil apparatus, a neck coil apparatus and/or a combined head/neck coil apparatus, in patients with pathological changes to the cervical spine in particular, (such as Bechterew's disease, torticollis, etc.), increased comfort when supporting the patient may be achieved due to the tilting function of the magnetic resonance coil apparatus.

It is further proposed that the position acquisition unit includes at least one position marking unit, which is arranged on a first base plate of the base unit. A position, (e.g., a tilting position), of the further coil component with respect to the base unit may herewith be acquired particularly easily. The position marking unit may be embodied such that a precise tilting position and/or a precise tilting angle of the further coil component with respect to the base unit may be acquired by the position marking unit.

The position marking unit is aligned particularly advantageously at right angles to the first base plate of the base unit. A longitudinal extension of the position marking unit is in particular herewith arranged and/or aligned at right angles to the first base plate of the base unit. In certain embodiments, an acquisition of a position, in particular a tilting position, of the further coil component may be achieved with respect to the base unit, since the position marking unit extends along a tilting movement of the further coil component away from the first base plate of the base unit.

Furthermore, it is proposed that the further coil component has a second base plate with a recess, wherein the position marking unit protrudes through the recess in a tilting position. A precise position of the further coil component with respect to the base unit may herewith be acquired particularly easily. A position, in particular a tilting position, of the further coil component with respect to the base unit may herewith be determined and/or acquired with the aid of a position of the second base plate with respect to the position marking unit. The recess of the second base plate may herewith be adjusted to a cross-sectional form and/or a cross-sectional surface of the position marking unit.

If the position marking unit has at least one marker element, a position, in particular a tilting position, of the further coil component with respect to the base unit may be acquired in a structurally easy manner. The at least one marker element may be formed by all marker elements that appear useful to the person skilled in the art. The at least one marker element nevertheless particularly advantageously includes a recess and/or a hole, in particular a cavity that is open on both sides. A simple position acquisition of the further coil unit with respect to the base unit may take place together in this way for instance by a mechanical position acquisition element and/or an optical position acquisition element.

It is also proposed that the position marking unit includes a number of marker elements for marking different positions of the further coil component with respect to the base unit, wherein the different positions on the position marking unit differ in respect of a number of marker elements and/or a marking position of the individual marker elements. The individual marker elements may be arranged on the position marking unit such that the individual marking positions of the marker elements together form an encoding for the individual tilting positions of the further coil component with respect to the base unit. If the individual marker elements are formed of holes, a hole encoding is available for instance for acquiring a tilting position of the further coil component with respect to the base unit. A position of the further coil component with respect to the base unit may be acquired in this way from an acquisition of a number and/or a marking position of the individual marker elements. Two marker elements are available for instance for a first position, in particular a first tilting position, of the further coil component. A single marker element is available for a second position, (e.g., a second tilting position), of the further coil component and just one single marker element is again available for a third position, (e.g., a third tilting position), of the further coil component, wherein the individual marker elements of the different marking positions are arranged at different positions on the position marking unit. In such a way, different position acquisition elements may be activated and/or used for the different positions of the further coil component within the position acquisition unit and a reliable and simple distinction between the individual positions may thus be achieved.

In an advantageous embodiment, it is proposed that the position acquisition unit includes at least one support element with at least one position acquisition element, wherein the support element is arranged on the further coil component. A position, in particular a tilting position, of the further coil component with respect to the base unit may advantageously be acquired by the position acquisition element on the basis of a change in position of the position acquisition element with respect to the position marking unit, e.g., a marker element of the position marking unit. By the support element, the at least one position acquisition element may particularly advantageously be arranged at a point and/or position for the position acquisition on the further coil component. The support element may be formed for instance of a printed circuit board and/or further support elements that appear useful to the person skilled in the art.

The support element is particularly advantageously arranged around the recess of the second base plate on the further coil component. A change in position, in particular the tilting position, of the further coil component with respect to the base unit may be acquired in a structurally simple and direct manner with the aid of a change in position of the position marking unit, e.g., of individual marker elements of the position marking unit, with respect to the at least one position acquisition element on the support unit.

It is also proposed that the position acquisition unit includes two support elements, wherein each of the two support elements is arranged on opposing edge areas on the recess of the second base plate on the further coil component. To this end, the first support element and the second support element may include at least one position acquisition element in each instance. The two position acquisition elements, which are arranged on different support elements, may be embodied particularly advantageously to correspond to one another. This is particularly advantageous if the individual marker elements of the position marking unit are formed of holes, e.g., of cavities that are open on both sides. The individual support elements may each include two position acquisition elements, so that the position acquisition elements are adjusted to the encoding of the position marking unit and a particularly simple reliable acquisition of a position of the further coil component with respect to the base unit may be achieved. For instance, individual position acquisition elements on the support elements herewith have a clear assignment to the marking positions of the individual position marker elements and thus for the encoding of the position marking unit.

An advantageous link between the two support elements with respect to a signal exchange may be achieved if the position acquisition unit has an electrical connection that electrically connects the two support elements with one another. Electrical and/or electronic position acquisition elements may herewith be used in particular.

The at least one position acquisition element particularly advantageously includes an optical position acquisition element. The optical position acquisition element may be for instance a component part of a light barrier unit, like in particular a light source and/or a transmit element, (e.g., a light-emitting diode, etc.), or a light detector and/or a receive element, (e.g., a photo diode, etc.). A position of the further coil component with respect to the base unit and thus a tilting position of the magnetic resonance coil apparatus with respect to a support surface of a patient support apparatus may be achieved particularly easily and reliably in this way.

In an alternative embodiment, further position acquisition elements that appear useful to the person skilled in the art are also conceivable at all times, like for instance electronic position acquisition elements and/or mechanical position acquisition elements.

In an advantageous development, it is proposed that the further coil component includes a base plate with a recording unit for recording the position marking unit. The recording unit may move together with the second base plate during a movement, in particular a tilting movement, of the further coil component with respect to the base unit relative to the position marking unit. The support unit may herewith in particular be arranged particularly easily and reliably on the further coil component in the vicinity of the recess of the further coil component and thus in the vicinity of the position marking unit. A receiving opening for receiving the position marking unit is particularly advantageously formed by the recess of the second base plate of the further coil component.

It is further proposed that the recording unit is embodied to be at least partially transparent, as a result of which a simple acquisition of a marker element, which is arranged on the position marking unit, may be achieved by a position acquisition element, which is arranged on the support unit. In this context, transparent is in particular to be understood to mean that the recording unit is embodied to be transparent with respect to a type of position acquisition. For instance, the recording unit for an optical position acquisition may be embodied to be transparent with respect to optical radiation. Moreover, the recording unit may also be embodied to be transparent with respect to electromagnetic radiation. Alternatively or in addition, the recording unit may also be embodied to be transparent with respect to a mechanical position acquisition. Furthermore, at least partially transparent is in particular to be understood to mean that the subregion of the recording unit that is relevant to the position acquisition is embodied to be transparent. The transparent subregion may include a transparent material, like for instance PMMA and/or polycarbonate (PC) etc., or be formed of recesses.

In an advantageous development, the magnetic resonance coil apparatus includes a head coil apparatus or a neck coil apparatus or a head/neck coil apparatus. Increased comfort when supporting the patient on account of the tilting function of the magnetic resonance coil apparatus may herewith particularly advantageously be achieved in patients with pathological changes to the cervical spine, like for instance the Bechterew's disease, torticollis etc. As an alternative here, the magnetic resonance coil apparatus may be formed by all the magnetic resonance coil apparatuses that appear useful to the person skilled in the art.

DETAILED DESCRIPTION

Figure 7:
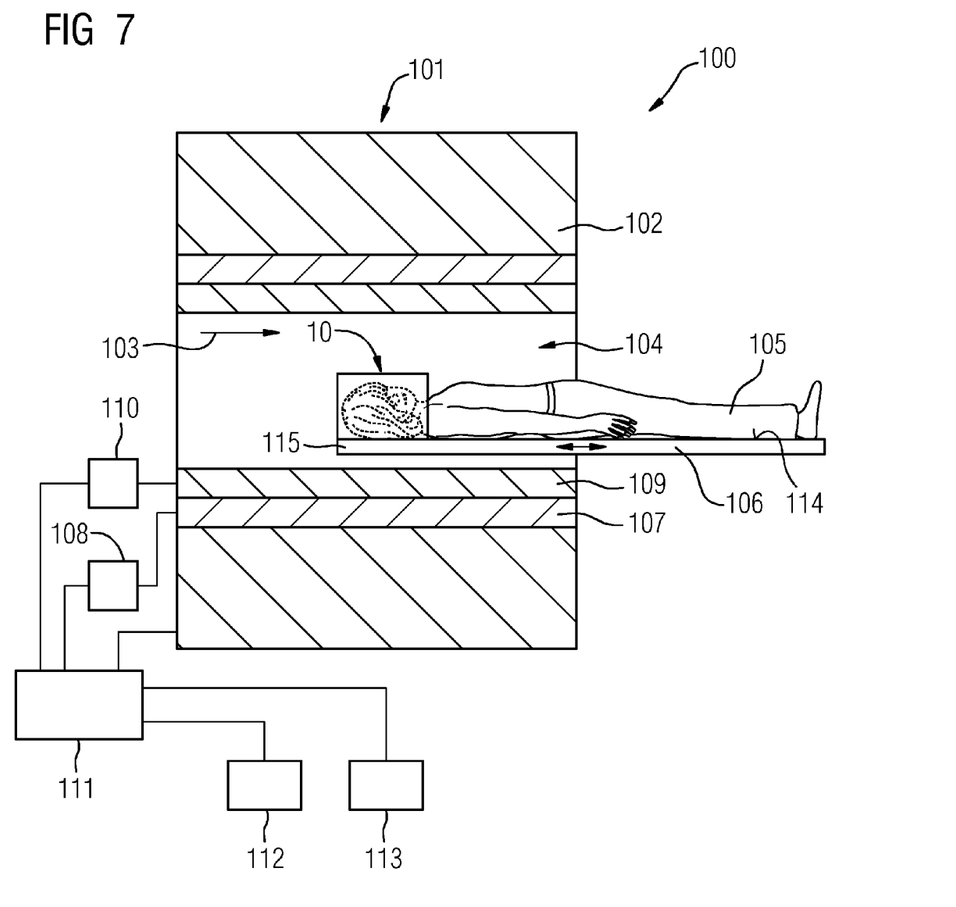
FIG. 7 depicts an example of a magnetic resonance apparatus in a schematic representation.

A magnetic resonance apparatus 100 is depicted schematically in FIG. 7. The magnetic resonance apparatus 100 includes a magnet unit 101 having a superconducting main magnet 102 for generating a powerful and in particular constant main magnetic field 103. Moreover the magnetic resonance apparatus 100 includes a patient receiving zone 104 for receiving a patient 105. The patient receiving zone 104 is embodied in the present exemplary embodiment in a cylindrical design and is surrounded cylindrically in a peripheral direction by the magnet unit 101. An embodiment of the patient receiving zone 104 that deviates therefrom may however be conceivable at any time. The patient 105 may be introduced into the patient receiving zone 104 by a patient support apparatus 106 of the magnetic resonance apparatus 100.

The magnet unit 101 also has a gradient coil unit 107 for generating magnetic field gradients that are used for position encoding during imaging. The gradient coil unit 107 is controlled by a gradient control unit 108 of the magnetic resonance apparatus 100. The magnet unit 101 furthermore includes a radio frequency antenna unit 109 and a radio frequency antenna control unit 110 intended for exciting a polarization that becomes established in the main magnetic field 103 generated by the main magnet 102. The radio frequency antenna unit 109 is controlled by the radio frequency antenna control unit 110 and radiates radio frequency magnetic resonance sequences into an examination space that is substantially formed by a patient receiving zone 104 of the magnetic resonance apparatus 100.

In order to control the main magnet 102, the gradient control unit 108 and in order to control the radio frequency antenna control unit 110, the magnetic resonance apparatus 100 has a system control unit 111. The system control unit 111 includes a processor unit and memory unit. Moreover, the system control unit 111 includes software and/or computer programs that are required for operation. The system control unit 111 centrally controls the magnetic resonance apparatus, such as performing a predetermined imaging gradient echo sequence for example. Moreover, the system control unit 111 includes an evaluation unit for evaluating image data. Control information such as imaging parameters, for example, as well as reconstructed magnetic resonance images may be displayed on a display unit 112, for example on at least one monitor, of the magnetic resonance apparatus 100 for viewing by an operator. Furthermore, the magnetic resonance apparatus 100 has an input unit 113 by which information and/or parameters may be input by an operator during a measurement procedure.

So-called local magnetic resonance coil apparatuses 10 are positioned on the patient 105 for a magnetic resonance examination on the patient 105 in order to acquire the magnetic resonance signals. The magnetic resonance coil apparatus 10 in the present exemplary embodiment is formed of a head coil apparatus (FIGS. 1 to 6). The head coil apparatus is configured to be tiltable, wherein to this end a support surface of the head coil apparatus is inclined with respect to a support surface 114 of the patient support apparatus 106. In patients 105 with pathological changes to the cervical column such as for instance with Bechterew's disease, torticollis, etc., this may result in an increase in comfort when supporting the patient 105.

The magnetic resonance coil apparatus 10 formed by the head coil apparatus is depicted in FIGS. 1 to 6. Alternatively, the magnetic resonance coil apparatus 10 may also be formed of further magnetic resonance coil apparatuses 10 that appear useful to the person skilled in the art, like for instance a neck coil apparatus or a head/neck coil apparatus or a knee coil unit, etc.

Figure 1:
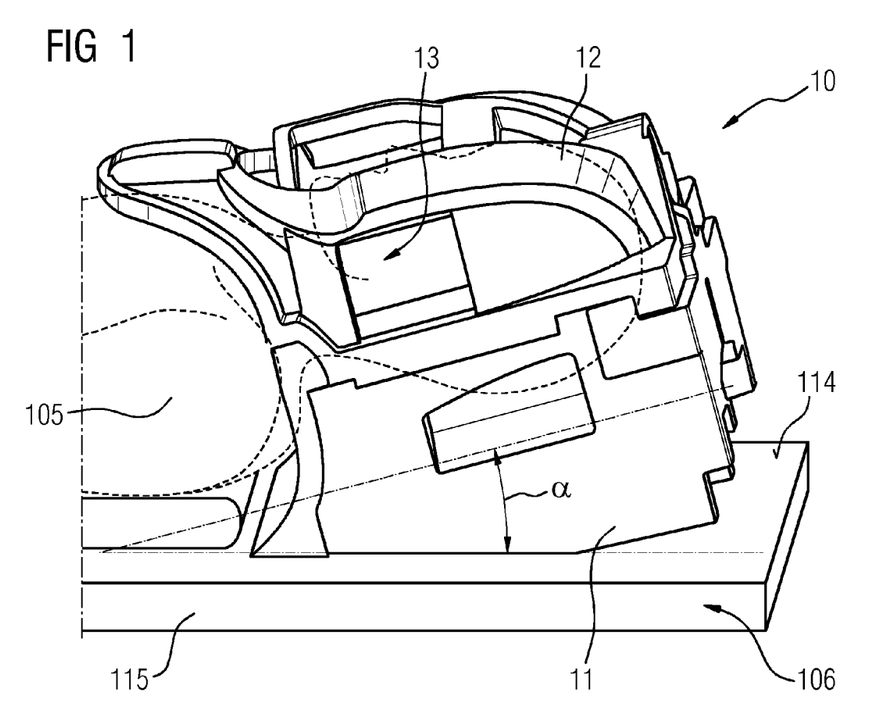
FIG. 1 depicts an example of a magnetic resonance coil apparatus in a schematic representation.

The magnetic resonance coil apparatus 10 includes a first coil unit 11 and a second coil unit 12, wherein the first coil unit 11 is formed of a posterior coil unit 11 and the second coil unit 12 is formed of an anterior coil unit 12. The posterior coil unit 11 and the anterior coil unit 12 herewith enclose a patient receiving zone 13 in order to receive a subregion of the patient 105. In the present exemplary embodiment, the patient receiving zone 13 is formed of a head receiving zone, which is embodied to receive a head of the patient 105.

The magnetic resonance coil apparatus 10 rests on the support surface 114 of the patient support apparatus 106 by the posterior coil unit 11. In the present exemplary embodiment, the head coil unit is arranged in a tilted position with respect to the support surface 114 on the support surface 114, wherein the head coil unit herewith includes a tilting angle α with respect to the support surface 114. In this tilted position of the head coil unit, a support surface for supporting the head of the patient 105 within the patient receiving zone 13 likewise includes a tilted position about the tilting angle α with respect to the support surface 114 of the patient support apparatus 106. In the present exemplary embodiment, the patient support apparatus 106 includes a couch 115 with the support surface 114 for supporting the patient 105.

Figure 2:
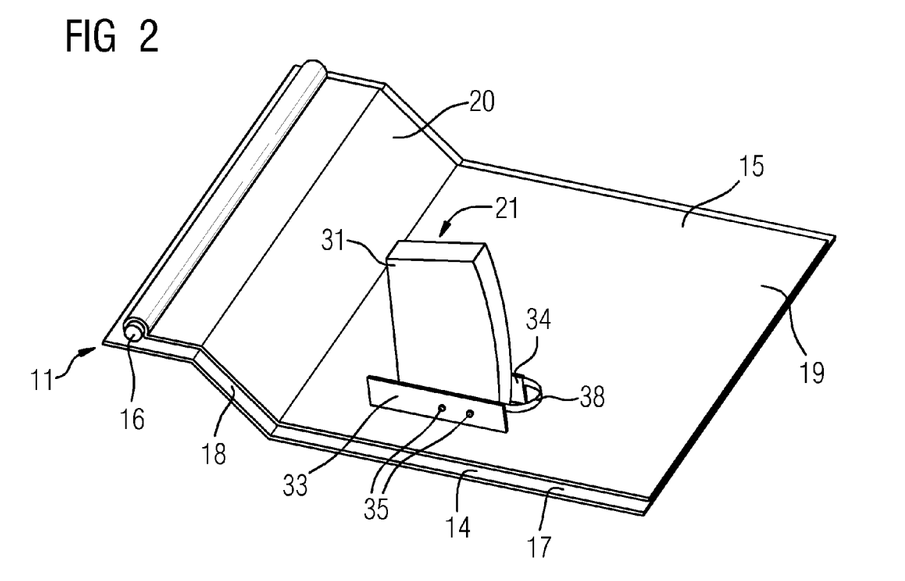
FIG. 2 depicts a schematic representation of an example of a base unit, a further coil component, and the position marking unit of the magnetic resonance coil apparatus in a first tilting position.
Figure 3:
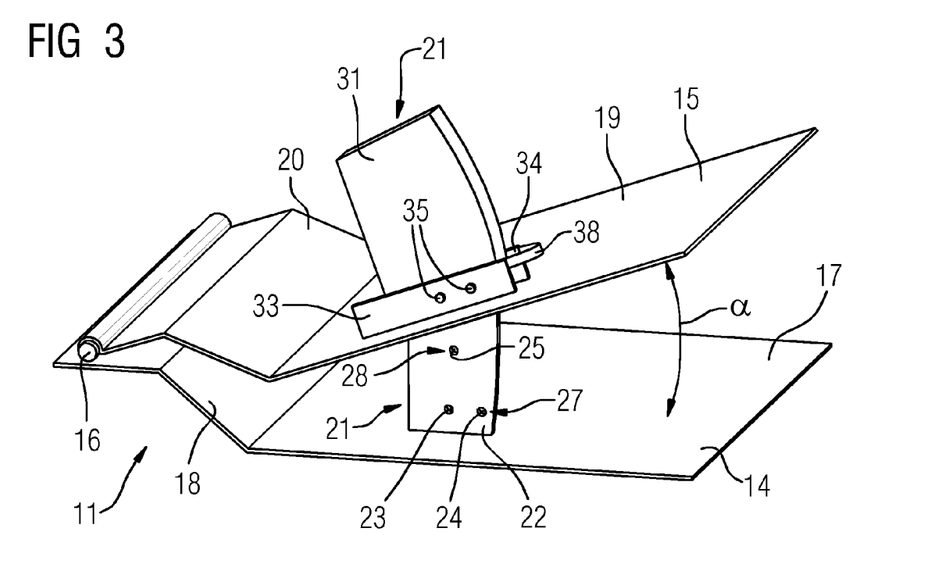
FIG. 3 depicts a schematic representation of an example of the base unit, of the further coil component and the position marking unit in a second tilting position.

For a tiltable positioning of the head coil apparatus, the posterior coil unit 11 includes a base unit 14 and a further coil component 15, wherein the further coil component 15 is arranged so as to be tiltable on the base unit 14 with respect to the base unit 14 (FIGS. 2 and 3). To this end the posterior coil unit 11 includes a swivel-joint unit 16, by which the further coil component 15 is arranged about an axis of rotation of the swivel-joint unit 16 so as to be tiltable with respect to the base unit 14.

The base unit 14 includes a first base plate 17, which is connected to the swivel-joint unit 16 by a connecting element 18 of the base unit 14. The further coil component 15 includes a second base plate 19, which, in a first position with a tilting angle of 0°, rests directly on the first base plate 17 of the base unit 14 (FIG. 2). The further coil component 15 likewise includes a connecting element 20, which connects the second base plate 19 to the swivel-joint unit 16.

Figure 4:
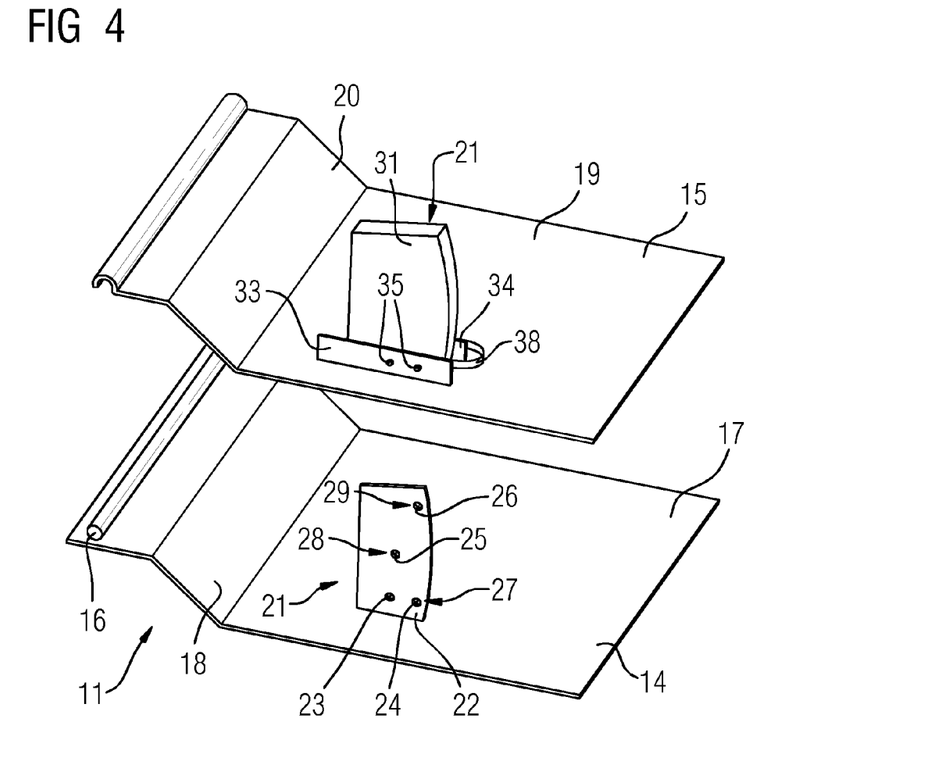
FIG. 4 depicts an example of the base unit and the further coil component in an exploded diagram.

In order to acquire the position of the further coil component 15 with respect to the base unit 14, the posterior coil unit 11 includes a position acquisition unit 21 (FIGS. 2 to 6). The position acquisition unit 21 includes a position marking unit 22, which is arranged on the base unit 14. The position marking unit 22 is herewith arranged on the first base plate 17 of the base unit 14. The position marking unit 22 is also arranged at right angles to the first base plate 17 on the first base plate 17 (FIGS. 3 and 4). A longitudinal extension in particular of the position marking unit 22 is herewith aligned at right angles to a base surface of the first base plate 17.

The position marking unit includes a number of marker elements 23, 24, 25, 26, which are formed by holes, in particular by cavities that are open on both sides (FIGS. 3 and 4). The holes, in particular the cavities that are open on both sides herewith extend at right angles to the longitudinal extension of the position marking unit 22 herethrough. The different marker elements 23, 24, 25, 26 herewith mark different marking positions 27, 28, 29 of the further coil component 15 with respect to the base unit 14, wherein the different marking positions 27, 28, 29 differ with respect to a number of marker elements 23, 24, 25, 26 and/or a position of the marker elements 23, 24, 25, 26. An arrangement of the individual marker elements 23, 24, 25, 26 on the position marking unit 22 herewith forms an encoding, in particular a hole encoding, for the position acquisition of the second coil unit 15 with respect to the first coil unit 14. The individual marker elements 23, 24, 25, 26 are herewith clearly assigned to the individual marking positions 27, 28, 29.

A first marking position 27 that marks in particular a position with a tilting angle α of 0° of the further coil component 15 with respect to the base unit 14 is characterized by two marker elements 23, 24. The two marker elements 23, 24 of the first marking position 27 are arranged in an edge region, which faces the first base plate 17, on the position marking unit 22, wherein an imaginary connecting line between the two marker elements 23, 24 runs in parallel or almost in parallel with the base plate 17.

A second marking position 28 that marks in particular a tilting position with a tilting angle α of for instance 10° of the further coil component 15 with respect to the base unit 14 only has a single marker element 25. A third marking position 29 that marks in particular a tilting position with a tilting angle α of for instance 20° (FIG. 3) of the further coil component 15 with respect to the base unit 14 likewise only has a single marker element 26. The marker element 25 of the second marking position 28 differs in respect of a position on the position marking unit 22 from the marker elements 23, 24 of the first marking position 27 and also from the marker element 26 of the third marking position 29. The marker element 26 of the third marking position 29 differs in respect of a position on the position marking unit 22 from the marker elements 23, 24 of the first marking position 27 and also from the marker element 25 of the second marking position 28.

In an alternative embodiment of the position marking unit 22, an overall number of marker elements 23, 24, 25, 26 may also deviate from the above description so that less than four or more than four marker elements 23, 24, 25, 26 are also conceivable. Moreover, a number and/or a positioning of the individual marker elements 23, 24, 25, 26 for a marking position 27, 28, 29 may also be embodied differently from the above description. Furthermore, further marking positions or marking positions 27, 28, 29, which have a tilting angle α that deviates from 0°, 10°, and 20° may also be identified and/or marked on the position marking unit 22 by the marker elements 23, 24, 25, 26, like for instance a marking position with a tilting angle α of the further coil component 15 with respect to the base unit 14 of 5° or 15°.

Figure 5:
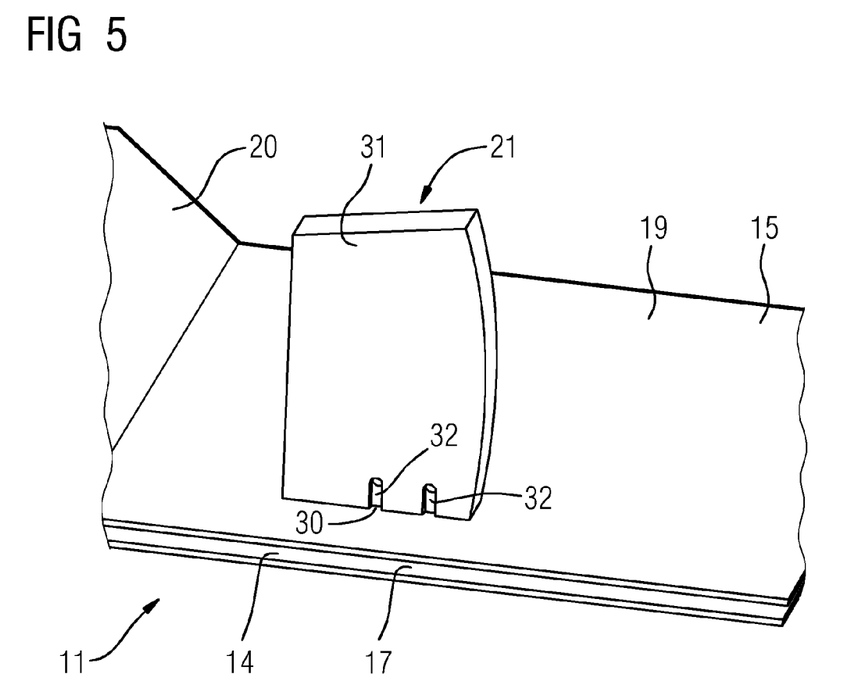
FIG. 5 depicts an example of the further coil component with a recording unit in a detailed view.

In order to acquire the tilting position and/or the tilting angle α of the further coil component 15 with respect to the base unit 14, the second base plate 19 of the further coil component 15 includes a recess 30, which may be rudimentally identified in FIG. 5. The position marking unit 22 arranged on the first base plate 17 of the base unit 14 herewith protrudes through the recess 30 so that a position of the further coil component 15 with respect to the base unit 14 may be determined and/or acquired with the aid of marker elements 23, 24, 25, 26 of the position marking unit 22 that are visible on the side of the further coil component 15 facing away from the base unit 14. The recess 30 of the second base plate 19 herewith includes a form that is adjusted to a cross-sectional surface of the position marking unit 22, so that a canting between the second base plate 19 and the position marking unit 22 is prevented even during a tilting movement from a first tilting position into a further tilting position.

A recording unit 31 for recording the position marking unit 22 is arranged on the second base plate 19 (FIGS. 2 to 5). The recording unit 31 is herewith arranged on the side of the second base plate 19 facing away from the base unit 14. The recording unit 31 herewith forms a housing for the position marking unit 22.

The recording unit 31 is also embodied to be at least partially transparent. To this end the recording unit 31 includes an edge region facing the second base plate 19, which has a transparent subregion 32, as is apparent in FIG. 5. The transparent subregions 32 are arranged on both sides of the recording unit 31. The transparent subregions 32 are arranged on the recording unit 31 such that two transparent subregions, which are arranged on different sides of the recording unit 31, lie in the first tilting position or in the second tilting position or in the third tilting position of the further coil component 15 with respect to the base unit 14 with at least one of the marker elements 23, 24, 25, 26 of the position marking unit 22 on an axis. The recording unit 31 for this purpose includes two transparent subregions 32 on both sides respectively, wherein a distance between the two subregions 32 arranged on one side corresponds to a distance between the two marker elements 23, 24 of the first marking position 27 on the position marking unit 22 for marking the first tilting position.

The transparent subregions 32 are embodied in the present exemplary embodiment to be transparent with respect to light beams and/or optical radiation. The transparent subregions 32 are formed by recesses within the recording unit 31. The transparent subregions 32 may basically also include a transparent material, like for instance a polycarbonate and/or PMMA and/or further transparent materials that appear useful to the person skilled in the art.

Furthermore, the position acquisition unit 21 includes at least one support element 33, 34. In the present exemplary embodiment the position acquisition unit includes two support elements 33, 34 (FIGS. 2 to 4 and 6). A number of support elements 33, 34 that deviate therefrom is however basically conceivable at any time in an alternative embodiment of the position acquisition unit 21.

The two support elements 33, 34 are arranged on the second base plate 19 of the further coil component 15. The two support elements 33, 34 are herewith also arranged on the recording unit 31, wherein the two support elements 33, 34 are arranged on the recording unit 31 such that the two support elements 33, 34 cover the transparent subregions 32 of the recording unit 31. The two support elements 33, 34 are herewith arranged on the further coil component 15 at least partially about the recess 31 through which the position marking unit 21 protrudes. The two support elements 33, 34 are also arranged on opposite sides of the recording unit 31, so that a support element 33, 34 is arranged on each opening side of the marker elements 23, 24, 25, 26 that are embodied as open cavities on both sides.

Figure 6:
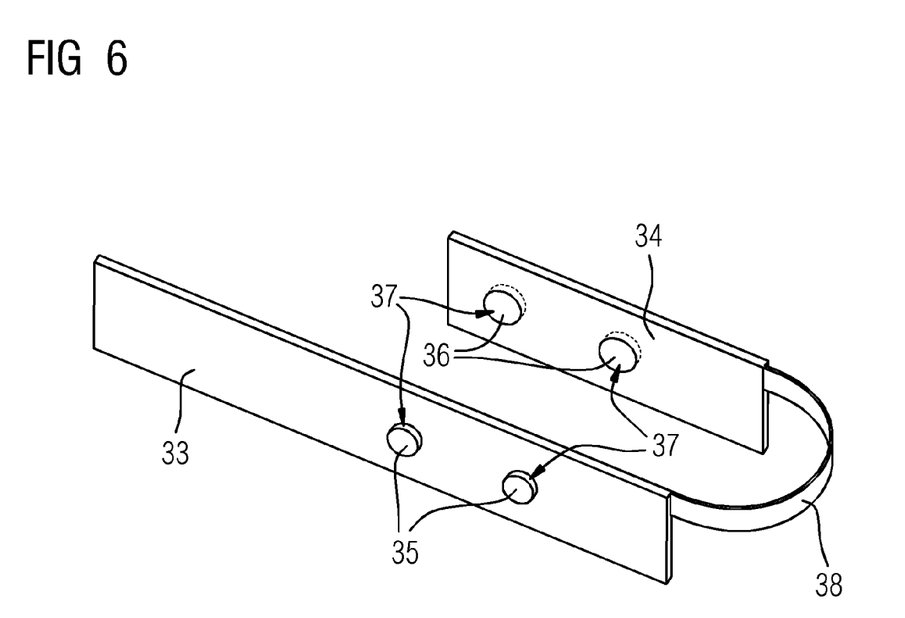
FIG. 6 depicts an example of a support element of the position marking unit in a detailed view.

The two support elements 33, 34 are depicted in more detail in FIG. 6. In the present exemplary embodiment the two support elements 33, 34 each include two position acquisition elements 35, 36. In an alternative embodiment, the support elements 33, 34 may each also include just one single position acquisition element 35, 36 or also more than two position acquisition elements 35, 36.

The two support elements 33, 34 are arranged here on the recording unit 31 such that each position acquisition element 35 of the first support element 33 is opposite to one of the position acquisition elements 36 of the second support element 34. The two opposing position acquisition elements 35, 36 thus include optical contact with one another (FIGS. 2 to 4 and 6) in a region of the position marker elements 23, 24, 25, 26 of the position marking unit 22. If the further coil component 15 is disposed in a tilting position with respect to the base unit 14, the position acquisition elements 35, 36 are arranged together with the respective marker elements 23, 24, 25, 26 on an axis and/or a straight line.

The position acquisition elements 35, 36 are currently formed of optical position acquisition elements. Two of the opposing position acquisition elements 35, 36 herewith form a light barrier unit 37 on the first support element 33 and the second support element 34. In the present exemplary embodiment, two light barrier units 37 are arranged overall on the two support elements 33, 34. It may also be conceivable in an embodiment that deviates therefrom for more than two light barrier units 37 to be arranged on the two support elements 33, 34.

The two light barrier units 37 each include a light-emitting element, such as for instance an LED and/or further light-emitting elements that appear useful to the person skilled in the art. Moreover, the two light barrier units 37 each include a light-receiving element, such as for instance a photo diode and/or further light-receiving elements that appear useful to the person skilled in the art. The light-transmitting elements are currently formed of the position acquisition elements 35 on the first support element 33, the light-receiving elements are currently formed of the position acquisition elements 36 on the second support element 34. Electrical signals in the event of an adjusted tilting position of the further coil component 15 with respect to the base unit 14 are generated by the light-receiving elements with the aid of the acquired optical signals, wherein the electrical sign is dependent on the adjusted tilting position so that a distinction may be made between the different tilting positions with the aid of the electrical signals.

The position acquisition unit 21 moreover includes an electrical connection 38 between the two support elements 33, 34 (FIGS. 2 to 4 and 6). The two position acquisition elements 35, 36 belonging to a light barrier unit 37 in each instance are connected to one another by the electrical connection 38.

A different selection of the two light barrier units 37 is activated as a function of a tilting position of the further coil component 15 and thus the magnetic resonance coil apparatus 10 with respect to the base unit 14. In the first tilting position of the further coil component 15 with respect to the base unit 14, in which a tilting angle $\alpha$ amounts to 0°, a signal is acquired by both light barrier units 37. In the second tilting position of the further coil component 15 with respect to the base unit 14, in which a tilting angle $\alpha$ amounts to 10°, a signal is only acquired by a first of the two light barrier units 37. In the third tilting position of the further coil component 15 with respect to the base unit 14, in which a tilting angle $\alpha$ amounts to 20°, a signal is likewise only acquired by a second of the two light barrier units 37. The activated light barrier unit 37 in the third tilting position of the further coil component 15 with respect to the base unit 14 herewith differs from the activated light barrier unit 37 in the second tilting position of the further coil component 15 with respect to the base unit 14.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil apparatus comprising:
a posterior coil unit comprising:
a base unit having a first base plate;
a coil component having a second base plate, wherein the second base plate of the coil component is configured to be tiltable on the base unit with respect to the base unit; and
a position acquisition unit having a position marking unit arranged on and extending from a surface of the first base plate of the base unit perpendicular to the first base plate and in a direction of the second base plate of the coil component,
wherein the position marking unit comprises a plurality of marker elements for providing different tilting positions or angles of the coil component with respect to the base unit, wherein each marker element is a hole extending through the position marking unit at a right angle to a longitudinal extension of the position marking unit, and
wherein the second base plate of the coil component comprises a recording unit for recording the position marking unit, wherein the recording unit provides a housing that at least partially encloses the position marking unit.

2. The magnetic resonance coil apparatus as claimed in claim 1, wherein the different positions on the position marking unit differ in respect of a number of marker elements, a marking position of the individual marker elements, or the number of marker elements and the marking position of the individual marker elements.

3. The magnetic resonance coil apparatus as claimed in claim 1, wherein the recording unit is configured to be at least partially transparent.

4. The magnetic resonance apparatus as claimed in claim 1, wherein the second base plate of the coil component comprises a recess, wherein the position marking unit protrudes through the recess in a tilting position.

5. The magnetic resonance coil apparatus as claimed in claim 4, wherein the position acquisition unit comprises at least one support element with at least one position acquisition element, wherein the support element is arranged on the coil component.

6. The magnetic resonance coil apparatus as claimed in claim 5, wherein the support element is arranged about the recess of the second base plate on the coil component.

7. A magnetic resonance coil apparatus as claimed in claim 4, wherein the position acquisition unit comprises two support elements, wherein each of the two support elements is arranged on opposing edge regions on the recess of the second base plate on the coil compartment.

8. The magnetic resonance coil apparatus as claimed in claim 1, wherein the position acquisition unit comprises at least one support element with at least one position acquisition element, wherein the support element is arranged on the coil component.

9. The magnetic resonance coil apparatus as claimed in claim 1, further comprising:
an anterior coil unit, wherein the anterior coil unit and the posterior coil unit provide a patient receiving zone positioned between the anterior coil unit and the posterior coil unit.

10. The magnetic resonance coil apparatus as claimed in claim 1, wherein the posterior coil unit further comprises:
a swivel-joint positioned at an end of the base unit connecting the base unit and the coil component,
wherein the coil component is tiltable with respect to the base unit about an axis of rotation of the swivel-joint.

11. The magnetic resonance coil apparatus as claimed in claim 9, wherein the anterior coil unit and posterior coil unit provide a head coil apparatus, a neck coil apparatus, or a head and neck coil apparatus.

12. A magnetic resonance coil apparatus comprising:
a posterior coil unit comprising:
a base unit having a first base plate;
a coil component having a second base plate having a recess, wherein the second base plate of the coil component is configured to be tiltable on the base unit with respect to the base unit; and
a position acquisition unit having a position marking unit arranged on and extending from a surface of the first base plate of the base unit perpendicular to the first base plate and in a direction of the second base plate of the coil component,
wherein the position acquisition unit comprises two support elements, wherein each of the two support elements is arranged on opposing edge regions on the recess of the second base plate on the coil compartment,
wherein the position acquisition unit comprises an electrical connection connecting the two support elements electrically with one another,
wherein the position marking unit comprises a plurality of marker elements for providing different tilting positions or angles of the coil component with respect to the base unit, wherein each marker element is a hole extending through the position marking unit at a right angle to a longitudinal extension of the position marking unit, and
wherein the position marking unit protrudes through the recess in a tilting position.

13. A magnetic resonance coil apparatus comprising:
a posterior coil unit comprising:
a base unit having a first base plate;
a coil component having a second base plate, wherein the second base plate of the coil component is configured to be tiltable on the base unit with respect to the base unit, and
a position acquisition unit having a position marking unit arranged on and extending from a surface of the first base plate of the base unit perpendicular to the first base plate and in a direction of the second base plate of the coil component,
wherein the position marking unit comprises a plurality of marker elements for providing different tilting positions or angles of the coil component with respect to the base unit, wherein each marker element is a hole extending through the position marking unit at a right angle to a longitudinal extension of the position marking unit,
wherein the position acquisition unit comprises at least one support element with at least one position acquisition element, wherein the support element is arranged on the coil component,
wherein the at least one position acquisition element comprises an optical position acquisition element.

* * * * *